United States Patent
Welner et al.

(10) Patent No.: US 10,768,209 B2
(45) Date of Patent: Sep. 8, 2020

(54) BATTERY ALARM FOR A HEARING AID, A HEARING AID AND A METHOD FOR THE USE IN A BATTERY ALARM

(75) Inventors: David Welner, Lyngby (DK); Ole Erik Toft, Brondby (DK)

(73) Assignee: WIDEX A/S, Varlose (DK)

( * ) Notice: Subject to any disclaimer, the term of this patent is extended or adjusted under 35 U.S.C. 154(b) by 657 days.

(21) Appl. No.: 12/101,185

(22) Filed: Apr. 11, 2008

(65) Prior Publication Data

US 2008/0187158 A1    Aug. 7, 2008

Related U.S. Application Data

(63) Continuation-in-part of application No. PCT/DK2005/000660, filed on Oct. 14, 2005.

(51) Int. Cl.
  *H04R 19/00*    (2006.01)
  *G01R 19/165*   (2006.01)
  *H04R 25/00*    (2006.01)

(52) U.S. Cl.
  CPC ..... *G01R 19/16542* (2013.01); *H04R 25/305* (2013.01); *H04R 2225/33* (2013.01)

(58) Field of Classification Search
  USPC .... 381/315, 323, 312, 331; 340/635, 636.15
  See application file for complete search history.

(56) References Cited

U.S. PATENT DOCUMENTS

| | | | | |
|---|---|---|---|---|
| 4,088,986 A | * | 5/1978 | Boucher | G08B 17/06 324/71.5 |
| 4,660,027 A | * | 4/1987 | Davis | 340/636.15 |
| 5,053,768 A | * | 10/1991 | Dix, Jr. | B60R 25/1018 180/167 |
| 5,304,986 A | * | 4/1994 | Motegi | 340/636.15 |
| 6,188,321 B1 | * | 2/2001 | Horstkotte et al. | 340/660 |
| 6,310,556 B1 | * | 10/2001 | Green et al. | 340/636.15 |
| 6,704,424 B2 | * | 3/2004 | Killion | 381/323 |
| 2002/0159613 A1 | | 10/2002 | Killion | |

(Continued)

FOREIGN PATENT DOCUMENTS

| | | |
|---|---|---|
| JP | 572799 U | 1/1982 |
| JP | 61247980 A | 11/1986 |

(Continued)

OTHER PUBLICATIONS

JP Office Action 2008-533863 dated May 10, 2011 with English translation.

*Primary Examiner* — Matthew A Eason
(74) *Attorney, Agent, or Firm* — Sughrue Mion, PLLC

(57) ABSTRACT

A method for monitoring the supply voltage of a hearing aid comprising an electric cell (1) comprises the steps of counting the number of times the supply voltage falls below a predetermined value, and setting an alarm flag if said number of times reaches a predetermined value. The method may be implemented using a circuit for monitoring the supply voltage of an electric cell. The circuit comprises a timer timing a detection interval, a detector for detecting drops in the voltage below a predetermined threshold value, a counter for counting the number of detections within said detecting interval, means (3) for setting an alarm flag if said number of times reaches a predetermined value within said first detection interval, and means (12) for suspending alarms during warm-up phase.

9 Claims, 5 Drawing Sheets

(56) References Cited

U.S. PATENT DOCUMENTS

2004/0140904 A1    7/2004   Bertness
2006/0017581 A1*   1/2006   Schwendinger et al. .. 340/636.1

FOREIGN PATENT DOCUMENTS

| JP | 1218293 A | 8/1989 |
|---|---|---|
| JP | 3048787 A | 3/1991 |
| JP | 2001093097 A | 4/2001 |
| JP | 3084237 U | 12/2001 |

* cited by examiner

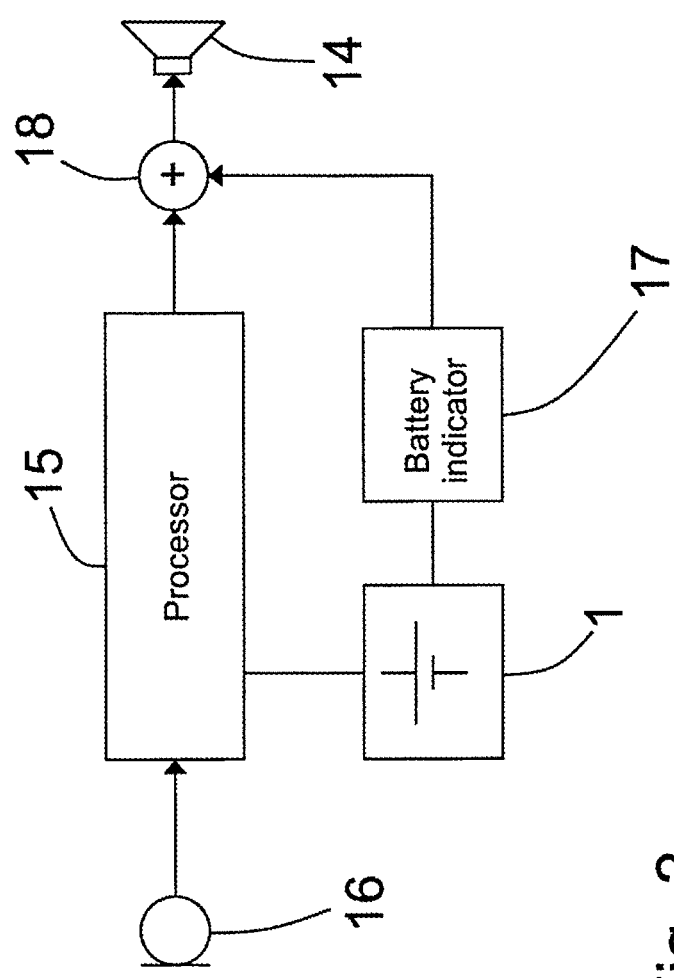

BATTERY ALARM FOR A HEARING AID, A HEARING AID AND A METHOD FOR THE USE IN A BATTERY ALARM

RELATED APPLICATIONS

The present application is a continuation-in-part of application No. PCT/DK/2005/000660; filed on 14 Oct. 2005, in Denmark and published as WO2007042026, the contents of which are incorporated hereinto by reference.

BACKGROUND OF THE INVENTION

1. Field of the Invention

The present invention relates to a method for the use in a battery alarm of a hearing aid, a circuitry for implementing the method and a hearing aid with such circuitry.

Modern digital hearing aids place rather critical demands on their supply voltage because under a certain voltage they do not operate, thus giving rise to distortion of the reproduced signal.

2. Prior Art

It is commonly known to provide the electric power supply for a hearing aid by means of a single electric cell. The electric cell, which normally has to fit within the limited space of the hearing aid housing, is usually a primary cell such as a zinc-air cell. The primary cell has to be replaced when it is worn out and can no longer provide sufficient voltage for the electronics of the hearing aid.

For the user it is of general interest to have a warning about the worn-out cell in good time before the hearing aid stops working, in order to replace the cell at a convenient time, e.g. before leaving home for work, the theatre, or other excursions, where it might be inconvenient to bring and replace the cell.

The output voltage from a primary cell, such as a zinc-air cell, normally varies over time, in dependence of a number of factors, such as the construction of the cell and the load applied. Generally, however, after an initial rapid drop the output voltage remains relatively constant decreasing only slowly over an extended period until, at the end of the lifetime of the cell, it decreases rapidly. The discharge characteristics for identical cells, i.e. same type, make and construction, are only subject to minor differences, whereas the same cell type, e.g. zinc-air, from different manufacturers will differ also in construction and have larger differences between their discharge characteristics. This makes the prediction of time until the cell is worn out harder.

It is commonly known to set off an alarm immediately if the cell voltage falls below a predetermined threshold value. This threshold value is set based on knowledge about typical discharge characteristics.

It has, however, been found that setting off an alarm simply based on a voltage threshold involves a number of problems.

A first problem is that if, for some reason, a temporary drop in the cell voltage suddenly occurs, it may lead to the alarm being set off at a very early stage, giving the user a false impression of the remaining time until the hearing aid will actually stop functioning properly.

One such temporary drop in the cell voltage could be caused by the hearing aid temporarily drawing a large current from the cell, e.g. during reproduction of a loud sound. Thus, even if, at normal load conditions, the remaining lifetime of the cell expected from a given discharge characteristic is sufficiently long not to justify the replacement of the battery at this time, the alarm will be set off. In the following description such a temporary drop in the supply voltage below a predetermined threshold value, e.g. due to a temporarily increased current being drawn from the cell, will be referred to as a brown-out.

A second problem is that the brown-outs will normally happen more and more frequently as the cell wears out and the cell voltage as a whole decreases. The increased frequency, with which the alarm will consequently be set off, could easily become a nuisance for the user.

It is the object of the present invention to overcome these problems.

SUMMARY OF THE INVENTION

The invention, a first aspect, provides a method for the use in a battery alarm of a hearing aid, said method comprising the steps of within a first predetermined time period counting the number of times the supply voltage falls below a predetermined value, setting a first alarm flag if said number reaches a first predetermined value within said first predetermined time period and checking said alarm flag for setting off an alarm using a state machine, said state machine comprising a warm up phase during which no alarm is set off.

In this manner a temporary drop in the cell voltage can be detected, and taken into account for the evaluation of whether an alarm should be set off or not. Thus, because each detection is not by itself the criterion on which the alarm is set off, unnecessary setting off of the alarm due to an uncritical temporary drop in the cell voltage can be prevented.

The warm-up phase ensures that no alarm is given off during the initial phase after the hearing aid has been switched on or the cell replaced, e.g. due to the fact that cell voltage is temporarily lower than under normal operation conditions, because the cell is cold.

In particular, an uncritical, temporary drop below the predetermined voltage threshold will not give off an alarm. Such an uncritical drop could be caused by temperature changes of the cell. Hence, if the user goes from room temperature inside to cold temperatures outdoors the cell in the hearing aid will cool off, and the cell voltage drop. If, however, the user takes a short trip outdoors, e.g. fetching firewood on a cold winter day, but otherwise stays indoors, the temporary voltage drop of the cell will be uncritical.

The invention, in a second aspect, provides a circuit for monitoring the supply voltage of a hearing aid, said circuit comprising a first timer timing a first detecting interval, a detector for detecting drops in said supply voltage below a predetermined threshold value, a first counter for counting the number of detections within said detecting interval, means for setting a first alarm flag if said number of times reaches a predetermined value within said first detecting interval and checking means, said checking means being adapted for checking said first alarm flag and setting off an alarm while suspending alarms during a warm-up phase.

The invention, in a third aspect, provides a method for setting off an alarm in a hearing aid, said method comprising the steps of:
 a0) entering a warm-up phase of a predetermined duration, during which no alarm flag is checked,
 a2) checking the state of a first alarm flag,
 b1) giving off an alarm if said first alarm flag is set, c1) suspending the possibility of giving off an alarm for a first predetermined time period, and d) returning to step a2).

Thus the alarm may be set off based on the flags set according to the other aspects of the invention, and subsequently the setting-off may be suspended for a given time period in order not to disturb the wearer unnecessarily.

The invention, in a fourth aspect, provides a hearing aid comprising, a circuit for monitoring the supply voltage of the hearing aid, the circuit comprising a first timer timing a first detecting interval, a detector for detecting drops below a predetermined threshold value in a supply voltage for said hearing aid, a first counter for counting the number of detections within said detecting interval, means for setting an alarm flag if said number of times reaches a predetermined value within said first detecting interval, and checking means adapted for checking said alarm flag for giving off an alarm, in dependence of said alarm flag while suspending alarms during a warm-up phase.

According to a preferred embodiment of said method according to the invention, the second alarm flag is set if within said first predetermined time period, said number of times reaches a second predetermined value higher than said first predetermined value. Having two levels of alarm flags set at different conditions, allows a better evaluation of whether an alarm should be set off or not.

According to a further preferred embodiment according to the invention, the number of times the supply voltage falls below a predetermined value within a second predetermined time period, following after said first predetermined time period, is counted, and a third alarm flag is set if within said predetermined second time period, said number of times reaches said first predetermined value. Thus if the first alarm condition persists, a further alarm flag may be set and taken into account for the decision of whether an alarm should be set off or not.

According to a preferred embodiment of the method, the second alarm flag is set if within said first predetermined time period, said number of times reaches a second predetermined value higher than said first predetermined value, or if within a second time period following after said first predetermined time period, the number of times the supply voltage falls below a predetermined threshold value reaches said first predetermined value. This effectively combines both of the second and third alarm flag into one, thus giving one flag less to take into account when taking the decision of whether an alarm should be set off or not.

According to yet a further embodiment of the method according to the invention, an alarm is set off if a predetermined one of said first to third flags is set. This allows a user to selectively allow which alarms should be given off. Thus, if the user feels that for his needs the first alarm is dispensable and would just be a disturbance, this alarm may be suppressed.

According to a preferred embodiment of the method according to the invention, an alarm is set off if any one of said first to third alarm flags is set. This is the simplest way of performing the evaluation of whether an alarm should be set off.

According to another preferred embodiment of the method according to the invention, an alarm is set off if said second alarm flag is set. This is a slightly more complex way of performing the evaluation of whether an alarm should be set off. This evaluation, however, yields a more precise result.

According to yet a further preferred embodiment of the method according to the invention, said method further comprises the step of suspending new alarms for a predetermined time after an alarm has been set off. By selecting this appropriate time appropriately long, unnecessary alarms disturbing the user can be avoided, even if the alarm condition persists.

Preferably, according to a further preferred embodiment said predetermined time depends on which one of the alarm flags caused the alarm to be set off. Thus, depending on the alarm level, a shorter or longer delay may be introduced before the alarm may be set off again. Alarms are thus likely to occur more and more frequently, until the user decides to change or recharge the cell, as the case may be.

According to a preferred embodiment of the circuit according to the invention, said circuit further comprises a second counter for counting the number of consecutive detecting intervals, in which the first alarm flag is set. This allows the setting of two levels of alarm flags, a first when frequent brownouts are detected, and a second if the frequent brown-outs occur for a prolonged period.

According to another preferred embodiment of the circuit according to the invention, the circuit further comprises means for setting off an alarm. Having means for setting off the alarm, allows the selective setting off of the alarm, dependent on pre-vious conditions, such as earlier brown-out periods, or other criteria indicating that the cell is getting worn out.

According to yet another preferred embodiment, said circuit according to the invention further comprises means for suspending new alarms for a predetermined time after an alarm has been set off. This will allow the user to be undisturbed for a prolonged period after the alarm has been set off. This feature could preferably be provided in connection with the means for setting off the alarm.

According to a preferred embodiment, said method according to the fourth aspect of the invention further comprises the steps of a0) checking the state of a second alarm flag prior to the step a1) and if said second alarm flag is set, b2) giving off an alarm, c2) suspending the possibility of giving off an alarm for a predetermined second time period shorter than said first predetermined time period, and d) returning to step a0). This allows the duration between possible alarms to be reduced if the cause for the alarm is considered important enough to increase the alarm level, by setting the second flag.

Preferably, the method according to the invention achieves this by having a further step of setting a second predetermined time period shorter than said first predetermined time period, prior to step b2).

According to yet another embodiment of said method according to the fourth aspect of the invention, said method further comprises the steps of f) checking the state of said second alarm flag again upon expiry of the second predetermined time period, and d) returning to step a0) if said second flag is not set, or g) if said second alarm flag is set h) incrementing a counter representing the number of alarms given off in step b2), and i) if said counter exceeds a predetermined number reducing said second predetermined time period to a shorter duration, and j) returning to step b2).

This allows a third alarm level with even shorter duration to be established based on the two first and second flags, but without having to check a third external flag.

BRIEF DESCRIPTION OF THE DRAWINGS

The invention will now be described in greater detail based on non-limiting exemplary embodiments, and with reference to the accompanying drawings on which FIG. 3 illustrates a schematic diagram of a hearing aid incorporating the invention.

DETAILED DESCRIPTION OF THE INVENTION

Figure 1:
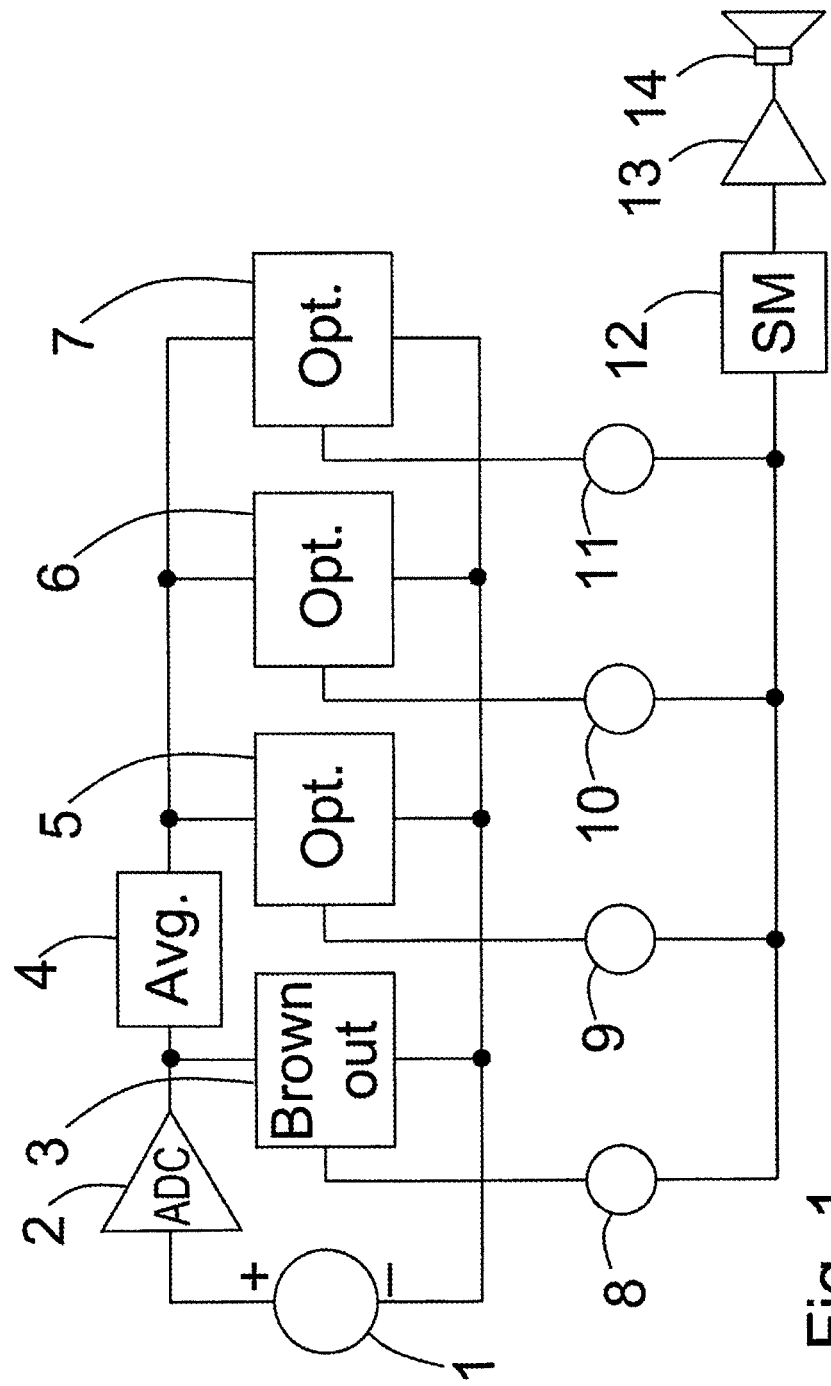
FIG. 1 illustrates a schematic diagram of circuitry for executing the method according to the invention.

FIG. 1 is a block diagram schematically showing circuitry for implementing the method of the invention. The circuitry includes a power source. In the following example the power source is assumed to be a primary cell 1, but the skilled person would understand that it could just as well be a secondary cell, a battery of cells 1, or in principle any kind of power source subject to voltage drops. It is also in the following assumed that the method is implemented in a digital hearing aid, but evidently it may be used anywhere there is a need for a battery alarm.

The voltage of the cell is measured using an analogue/digital converter 2, converting the momentary voltage into a corresponding digital value for the use in the digital circuitry of a hearing aid.

The value of the momentary cell voltage is fed to a brownout module 3, which will be described in further detail below. For the use in further optional modules 5, 6, 7 the digital value corresponding to the momentary cell voltage may be averaged in an averaging means 4. These further modules 5, 6, 7 do not as such form part of the present invention, and will not be described further. It should be noted, though, that there may be any number of such further modules 5, 6, 7 including none at all. The circuitry further comprises means 8, 9, 10, 11 for enabling each of the modules. Thus, if under given circumstances, some of the criteria on which alarm flags may be provided by the modules are not of interest, the respective modules 3, 5, 6, 7 may be disabled.

The brownout module 3 repeatedly counts the number of brownouts within a predetermined time period. The time period is preferably in the interval from approximately 30 seconds to approximately 4 minutes. If, at the end of or any time during the time period, the number of brownouts is found to exceed a first value, e.g. 30, then an alarm flag YellowAlarm is set, if not the flag is not set. If, at the end of the time period, the number of brownouts is found to exceed a second value higher than said first value, e.g. 40, then an alarm flag OrangeAlarm is set, if not the flag is not set. Additionally, or alternatively the alarm flag OrangeAlarm may be set, if the number of consecutive periods where the alarm flag YellowAlarm was set, exceeds a predetermined value. Also, according to another embodiment, a further alarm flag could be set if the number of consecutive periods where the alarm flag YellowAlarm was set, exceeds a predetermined value.

The alarm flags are preferably used in a state machine 12, deciding, when and how often an alarm should be set off. The alarm is preferably an acoustic alarm comprising a driver 13 and a transducer 14.

Figure 2A:
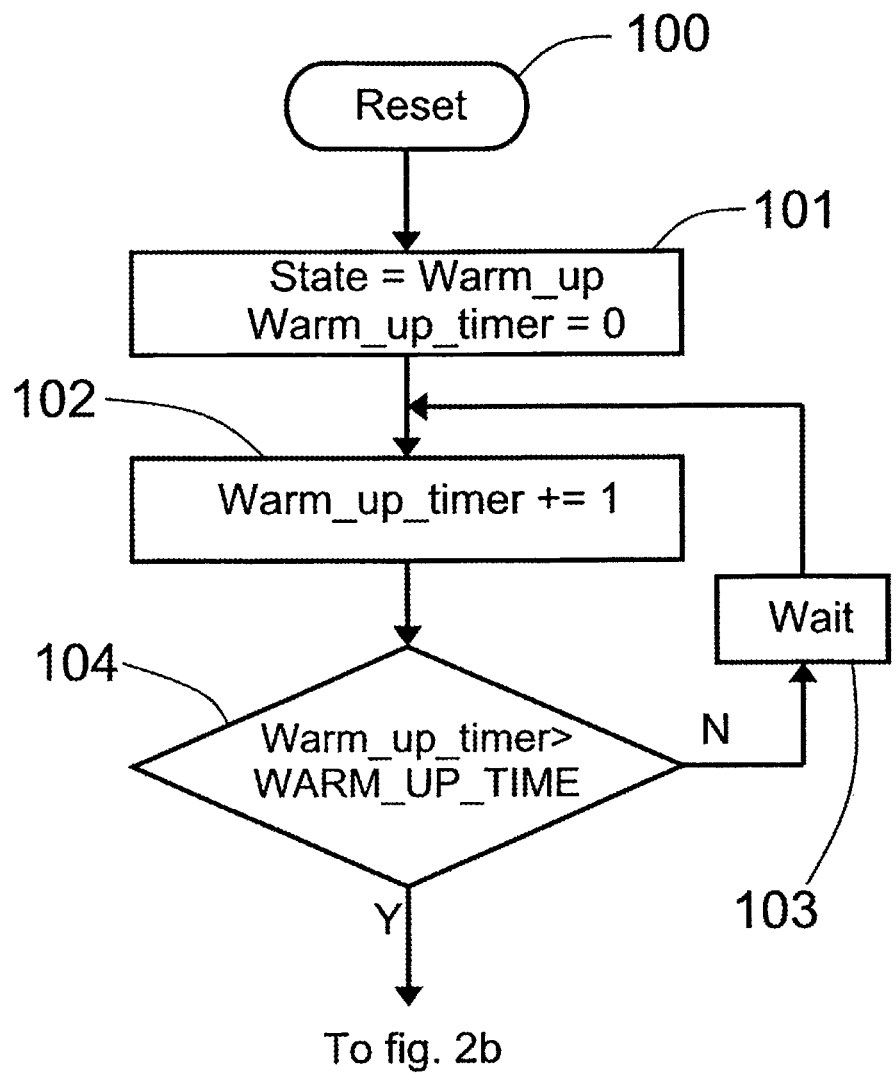
FIG. 2a illustrates a flow chart showing a first part of the method according to the invention.
Figure 2B:
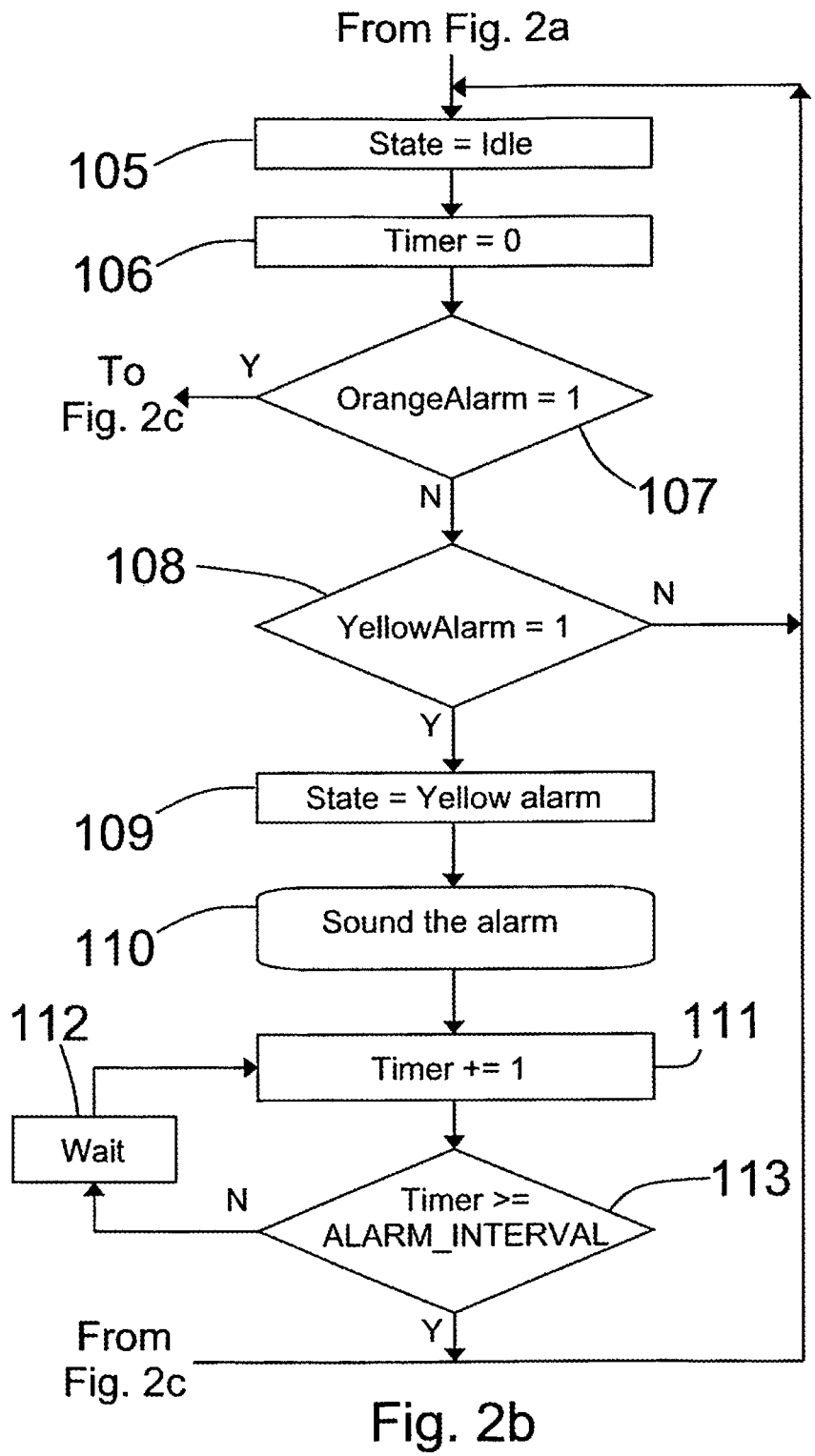
FIG. 2b illustrates a flow chart showing a second part of the method according to the invention
Figure 2C:
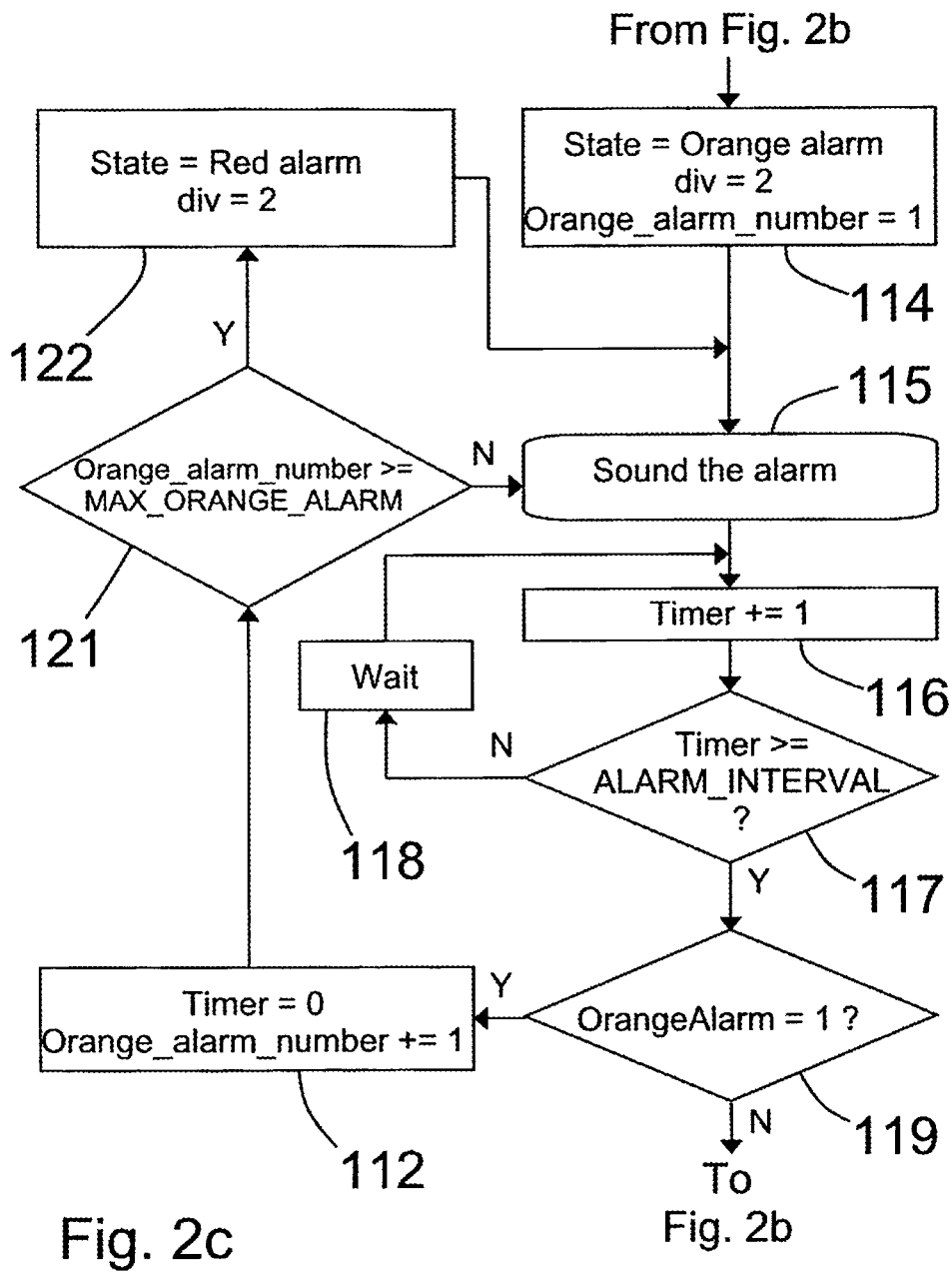
FIG. 2c illustrates a flow chart showing a third part of the method according to the invention.

FIGS. 2a to 2c illustrate the operation of a state machine 12 implementing the method for setting off alarms based on external flags, and suspending subsequent alarms for predetermined time periods in order not to disturb the user unnecessarily.

The state machine 12 is initialized by a reset 100 in FIG. 2a. The reset 100 would typically be the insertion of a new cell in the hearing aid or the switching on of the hearing aid, e.g. at the beginning of the day. After reset the state machine 12 enters a warm-up phase, which begins with the resetting 101 of the warm_up_timer to zero. The value of the warm_up_timer is repeatedly incremented in 102 until the value of warm_up_timer exceeds a predetermined value WARM_UP_TIME in 104. Each repetition involves a pause 104 of a predetermined duration, and consequently the warm-up phase has also a predetermined duration. The warm-up phase ensures that no alarm is given off during the initial phase after the hearing aid has been switched on or the cell replaced, e.g. due to the fact that cell voltage is temporarily lower than under normal operation conditions, because the cell is cold.

After the initial warm-up phase the state machine 12 enters its normal operating mode, in which it monitors the flags, see FIGS. 2b and 2c. The normal operating mode generally consists of two parts, in the following referred to as external mode and internal mode. In the external mode, which is depicted in FIG. 2b, the externally set flags YellowAlarm and OrangeAlarm are monitored. In the internal mode depicted in FIG. 2c a further flag RedAlarm, which is set by the state machine 12 itself, is also monitored.

After the initial warm-up phase of FIG. 2a, the state machine 12 enters the external mode in FIG. 2b. In the external mode the alarm state is first reset to Idle 105. Also the counter Timer is reset to zero 106. The state machine 12 then checks whether the external alarm flags are set. In this embodiment there are only the two flags OrangeAlarm and YellowAlarm, both of which may assume the logical states 0 or 1, where 1 indicates that the flag is set. These flags are set externally with respect to the state machine 12 by other circuitry of the hearing aid and are only checked by the state machine 12.

First the higher alarm condition OrangeAlarm is checked in 107. If the OrangeAlarm flag is set, the state machine 12 enters a yellow alarm condition, described in detail later in connection with FIG. 2c.

If OrangeAlarm is not set, then the lower alarm condition YellowAlarm is checked in 108.

If YellowAlarm is not set there is no alarm condition and the state machine 12 repeats the loop by returning to 105 setting the alarm state to Idle.

If YellowAlarm is set then the state machine 12 sets the alarm state to Yellow Alarm in 109, and effects that an alarm is given off in 110.

Then in 111 the counter Timer is incremented by one. If the counter Timer has not reached a predetermined value ALARM_INTERVAL in 113, Timer is incremented repeatedly, in 111 with a pause introduced in 112, until Timer reaches the predetermined value in 113. Only after the time delay provided by the incrementing of Timer and associated pauses, the state machine 12 returns to 105. Thus, not until then will the states of the flags be checked, and no alarm can be given. The skilled person will realise that this preferred way of suspending new alarms for a predetermined period after an alarm has been set off is not the only possibility. As an alternative to the waiting loop disclosed, a separate timed disable flag could be used to temporarily disable the alarm.

Thus with an appropriate choice of the duration of the pauses and value of ALARM_INTERVAL the state machine 12 suspends the possibility of giving off an alarm sufficiently long not to disturb the user. For this Yellow Alarm condition two hours before the next possible alarm would be considered appropriate. Since, however, it may depend on the actual user's preference it may readily be changed by assigning another value to ALARM_INTERVAL.

Returning now to the case, where the flag OrangeAlarm is set when checked in 107. In this case the state is set to Orange Alert in 114. Also, in 114 the variable Div is set to two, and the variable Orange_Alarm_Number is set to one. Then in 115 it is effected that an alarm is set off. The actual nature of the alarm set off in 115 may differ from that of 110, but they may also be indistinguishable for the user.

After the alarm has been set off the state machine 12 enters a loop 116, 117, 118 corresponding essentially to the loop 111, 113, 121 except that the counter Timer is only incremented until it equals or exceeds ALARM_INTERVAL/Div, i.e. half the count. Consequently the delay until the state machine 12 will be able to set off an alarm again, e.g. by returning via 119 to 105, is only half as long after an orange alarm as after a yellow alarm.

However, it should be noted that after the alarm has been set off in 115, the state machine does not necessarily return to 105. Rather, before returning to 105 it is checked in 119, whether or not the flag OrangeAlarm is still set. If OrangeAlarm is not set anymore the state machine 12 returns to the state Idle in 105. If OrangeAlarm is still set, then in 120 Timer is reset to zero and the variable Counter Alarm Number is incremented by one.

Then in 121 it is checked whether the incremented value of Orange_Alarm Number equals or exceeds a predetermined value MAX_ORANGE_ALARM. If not, the alarm is set off again in 115.

If Orange_Alarm Number equals or exceeds the predetermined value MAX_ORANGE_ALARM, then in 122 the state Red Alert is set and the variable Div is set to four, before the alarm is set off in 115.

Here it should be noted, that with Div set to four, the delay until the state machine 12 will be able to set off an alarm again is only a quarter as long after a red alarm as after a yellow alarm.

Though it may depend on the actual users preferences, it is currently preferred to have a value for ALARM_INTERVAL, corresponding to a Timer count of pauses summing up to two hours. Thus after a yellow alarm two hours must pass, before the user may be disturbed again with the alarm. Yellow alarm is more critical and only one hour will have to pass. Finally after red alarm the user may be disturbed again after half an hour. It should be noted though that even after an orange or even after a red alarm, the state machine 12 may return to the state Idle upon and stay there if no alarm flags are set.

As can be seen from FIG. 3 the battery alarm according to the invention may be incorporated in a hearing aid. Elements in FIG. 3 corresponding to elements in FIG. 1 share reference numerals. The hearing aid comprises a power supply in the form of an electric cell 1 or a battery of cells. The battery inter alia supplies a signal processor 15. The signal processor processes an input signal from an input transducer, e.g. a microphone 16. The processed input signal is output from the signal processor 15 to the user via an output transducer 14.

In accordance with the invention the supply voltage from the electric cell 1 is monitored by the battery indicator 17 in which the method according to the invention is incorporated. If, according to the method outlined above an alarm is to be given off, the battery indicator produces an alarm signal, which is preferably added to the normal output signal from the signal processor 15 in an adder 18. Alternatively, the alarm signal may be generated or processed by the signal processor 15, rather than being generated as a separate signal and added to the output signal.

We claim:

1. A method for operating a battery alarm of a hearing aid, said method comprising the steps of
   preventing said alarm from turning on during a predetermined warm-up time period after a power supply to said hearing aid is turned on,
   subsequent to said predetermined warm-up time period:
   a) counting the number of times a supply voltage for said hearing aid falls below a predetermined threshold value during a first predetermined time period,
   b) setting a first alarm flag if said number reaches a first predetermined count value within said first predetermined time period, and setting a second alarm flag if said number of times reaches a second predetermined count value higher than said first predetermined count value within said first predetermined time period,
   c) checking the states of said first and second alarm flags,
   d) giving off an alarm if either of said first or second alarm flags is set,
   e) suspending new alarms for a first predetermined delay time period if the alarm is given off in response to the setting of said first alarm flag, and
   f) suspending new alarms for a second predetermined delay time period shorter than said first predetermined delay time period if the alarm is given off according to the setting of said second alarm flag.

2. A method according to claim 1, further comprising the steps of:
   g) checking the state of said second alarm flag again upon expiry of the second predetermined delay time period;
   h) returning to said counting step a) if said second alarm flag is not set;
   i) if said second alarm flag is still set in step g), giving off the alarm in step d) and counting the number of consecutive second predetermined delay time periods;
   j) if the number of consecutive second predetermined delay time periods exceeds a predetermined number, reducing the duration of said second predetermined delay time period; and
   returning to step f).

3. A hearing aid having a battery alarm, said hearing aid comprising:
   means for preventing said alarm from turning on during a predetermined warm-up time after a power supply to said hearing aid is turned on,
   a detector for detecting when a supply voltage for said hearing aid drops below a predetermined threshold value after said warm-up time;
   a first counter for counting the number of times said supply voltage falls below said predetermined threshold value within a detecting interval;
   means for setting a first alarm flag if said number of times reaches a first predetermined value within said detecting interval, and setting a second alarm flag if said number of times reaches a second predetermined value higher than said first predetermined value within said detecting interval;
   first checking means for checking the states of said first and second alarm flags;
   means for giving off an alarm if either said first or second alarm flags is set; and means for suspending new alarms for a first predetermined time period if the alarm is given off in response to the setting of said first alarm flag, and suspending new alarms for a second predetermined time period shorter than a first predetermined time period if the alarm is given off in response to setting of said second alarm flag.

4. A hearing aid according to claim 3, said hearing aid further comprising:
   second checking means for checking the state of said second alarm flag again upon expiry of the second predetermined time period;
   a second counter for counting the number of consecutive second predetermined time periods if said second alarm flag is still set; and
   reducing means for reducing the duration of said second predetermined time period if the number of consecutive second predetermined time periods exceeds a predetermined number.

5. A method for operating a battery alarm of a hearing aid, said method comprising the steps of preventing said alarm from turning on during a predetermined warm-up time period beginning with the turning on of a power supply to said hearing aid, regardless of a charge state of a battery subsequent to said predetermined warm-up time period, detecting at least one of first and second battery voltage anomalies and providing a battery alarm if either of said first and second anomalies is detected, further comprising the step of suspending new battery alarms for a predetermined period of time the duration of which is dependent at least in part on which of said first and second battery anomalies was detected.

6. A method according to claim 5, wherein said alarm is prevented during said warm-up period even if either of said first or second battery voltage anomalies is detected during said warm-up period.

7. A method according to claim 5, wherein said first battery voltage anomaly is said battery voltage being below a threshold for a first period of time, and said second voltage anomaly is said battery voltage being below said threshold for a second period of time longer than said first period of time.

8. A method for operating a battery alarm of a hearing aid, said method comprising the steps of
   a) detecting at least one of first and second battery voltage anomalies;
   b) giving off an alarm if either one of said first and second anomalies is detected; and
   c) suspending new alarms for a predetermined delay time period after said alarm is given off, at least part of said predetermined delay time being after the given off alarm has ended, the duration of said predetermined delay period being dependent at least in part on which of said first and second battery voltage anomalies was detected.

9. A method according to claim 8, wherein no new alarms are given off during said predetermined delay time even if one of said first and second battery voltage anomalies is detected during said predetermined delay time.

* * * * *